US009666120B2

(12) United States Patent
Lee et al.

(10) Patent No.: US 9,666,120 B2
(45) Date of Patent: May 30, 2017

(54) ORGANIC LIGHT EMITTING DISPLAY DEVICE FOR PREVENTING DETERIORATION OF DRIVING TRANSISTORS

(71) Applicant: LG Display Co., Ltd., Seoul (KR)

(72) Inventors: Seon Mi Lee, Hanam-si (KR); Woo Jin Nam, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 106 days.

(21) Appl. No.: 14/559,416

(22) Filed: Dec. 3, 2014

(65) Prior Publication Data

US 2015/0187260 A1 Jul. 2, 2015

(30) Foreign Application Priority Data

Dec. 30, 2013 (KR) .................. 10-2013-0166795

(51) Int. Cl.
*H01L 27/146* (2006.01)
*G09G 3/3208* (2016.01)
*G09G 3/20* (2006.01)
*G09G 3/3225* (2016.01)
*H01L 27/32* (2006.01)

(52) U.S. Cl.
CPC ......... *G09G 3/3208* (2013.01); *G09G 3/2003* (2013.01); *H01L 27/3272* (2013.01); *G09G 2300/0452* (2013.01); *G09G 2300/0842* (2013.01); *G09G 2300/0871* (2013.01); *G09G 2310/0289* (2013.01); *G09G 2320/0233* (2013.01); *G09G 2320/043* (2013.01); *H01L 27/3213* (2013.01)

(58) Field of Classification Search
None
See application file for complete search history.

(56) References Cited

U.S. PATENT DOCUMENTS

| 2009/0072226 | A1* | 3/2009 | Koo ................... H01L 27/3246 257/40 |
| 2009/0135111 | A1 | 5/2009 | Yamamoto et al. |
| 2009/0243482 | A1 | 10/2009 | Tohyama et al. |
| 2011/0101346 | A1* | 5/2011 | Tateishi ................ H01L 27/12 257/43 |
| 2013/0270109 | A1* | 10/2013 | Morita ................. C23C 14/086 204/298.13 |

FOREIGN PATENT DOCUMENTS

WO   WO 2009/110623 A1   9/2009

* cited by examiner

*Primary Examiner* — Benjamin C Lee
*Assistant Examiner* — David Lee
(74) *Attorney, Agent, or Firm* — Birch, Stewart, Kolasch & Birch, LLP

(57) ABSTRACT

An organic light emitting display device including an emission unit and a pixel circuit unit. The emission unit includes an organic light emitting diode. The pixel circuit unit includes a driving transistor, at least one or more switching transistors, a capacitor, a light blocking unit, and an opening in which the light blocking layer is not formed. The light blocking unit includes a light blocking layer which blocks light input to the pixel circuit unit. The pixel circuit unit is configured to drive the emission unit and selectively block the light input to the pixel circuit unit.

19 Claims, 8 Drawing Sheets

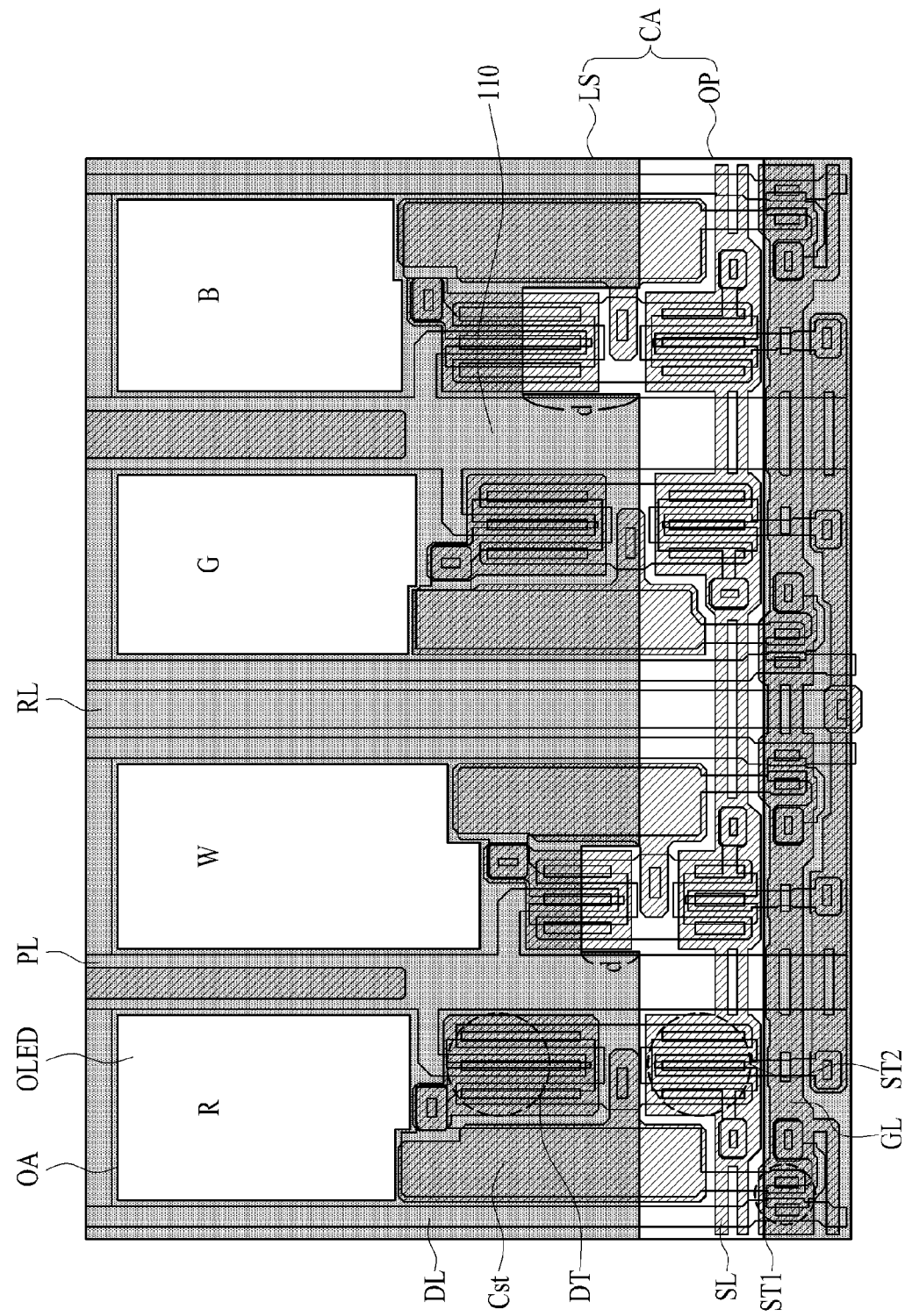

ORGANIC LIGHT EMITTING DISPLAY DEVICE FOR PREVENTING DETERIORATION OF DRIVING TRANSISTORS

CROSS-REFERENCE TO RELATED APPLICATIONS

This application claims the benefit of the Korean Patent Application No. 10-2013-0166795 filed on Dec. 30, 2013, which is hereby incorporated by reference as if fully set forth herein.

BACKGROUND

Field of the Invention

The present invention relates to an organic light emitting display device, and more particularly, to an organic light emitting display device for adjusting a threshold voltage shift.

Discussion of the Related Art

Flat panel display devices in related art are becoming thin and light and have low consumption power. Liquid crystal display (LCD) devices included in flat panel display devices include a thin film transistor (TFT) and have high quality resolution, color display, and image quality. Liquid crystal display devices are commercialized for notebook computers, tablet computers, and desktop computers. In particular, organic light emitting display devices are self-emitting devices, and have a fast response time, low power consumption, high emission efficiency, and a wide viewing angle.

FIG. 1 is an exemplary diagram schematically illustrating a related art organic light emitting display device. The related art organic light emitting display device includes an emission unit OA including an organic light emitting diode OLED and a pixel circuit unit CA that includes a first switching transistor ST1, a second switching transistor ST2, a driving transistor DT, and a capacitor Cst which drives the emission unit OA.

The pixel circuit unit CA includes a data line DL through which a data voltage Vdata is supplied to the first switching transistor ST1, a gate line GL through which a scan signal Scan is supplied, a power line PL through which a first driving voltage Vdd is supplied to the driving transistor DT, a sensing signal line SL through which a sense signal Sense is supplied to the second switching transistor ST2, and a reference voltage line RL through which a reference voltage Vref is supplied. The organic light emitting diode OLED included in the emission unit OA is electrically connected between a source of the driving transistor DT and a cathode voltage Vss terminal. The organic light emitting diode OLED emits light with a data current Ioled supplied from the driving transistor DT.

The pixel circuit unit CA includes a light blocking layer 20 which is formed for preventing external light from being input to the first switching transistor ST1, second switching transistor ST2, and driving transistor DT of the pixel circuit unit CA. That is, the light blocking layer 20 covers the pixel circuit unit CA.

However, in the related art organic light emitting display device, a characteristic deviation of a threshold voltage "Vth" of a driving transistor occurs in each pixel due to a process differential, and a plurality of the driving transistors are deteriorated at different speeds when the related art organic light emitting display device is driven for a long time. The deterioration of the plurality of the driving transistors causes a quality of an image to be degraded.

SUMMARY

Accordingly, the present invention is directed to providing an organic light emitting display device that substantially obviates one or more problems due to limitations and disadvantages of the related art. An aspect of the present invention is directed to providing an organic light emitting display device that controls a threshold voltage shift of a transistor to improve a reliability of a threshold voltage.

Additional advantages and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these and other advantages and in accordance with the purpose of the invention, as embodied and broadly described herein, there is provided according to an embodiment of the present invention an organic light emitting display device including an emission unit configured to include an organic light emitting diode; and a pixel circuit unit including a driving transistor, at least one or more switching transistors, and a capacitor to drive the emission unit. The pixel circuit unit includes a light blocking unit including a light blocking layer which blocks light input to the pixel circuit unit; and an opening in which the light blocking layer is not formed, and the pixel circuit unit is configured to selectively block the light input to the pixel circuit unit.

In addition to the aforesaid objects of the present invention, other features and advantages of the present invention will be described below, but will be clearly understood by those skilled in the art from descriptions below. It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings:

FIG. 9 is a plan view schematically illustrating an organic light emitting display device according to a fourth embodiment of the present invention.

DETAILED DESCRIPTION OF THE INVENTION

Figure 1:
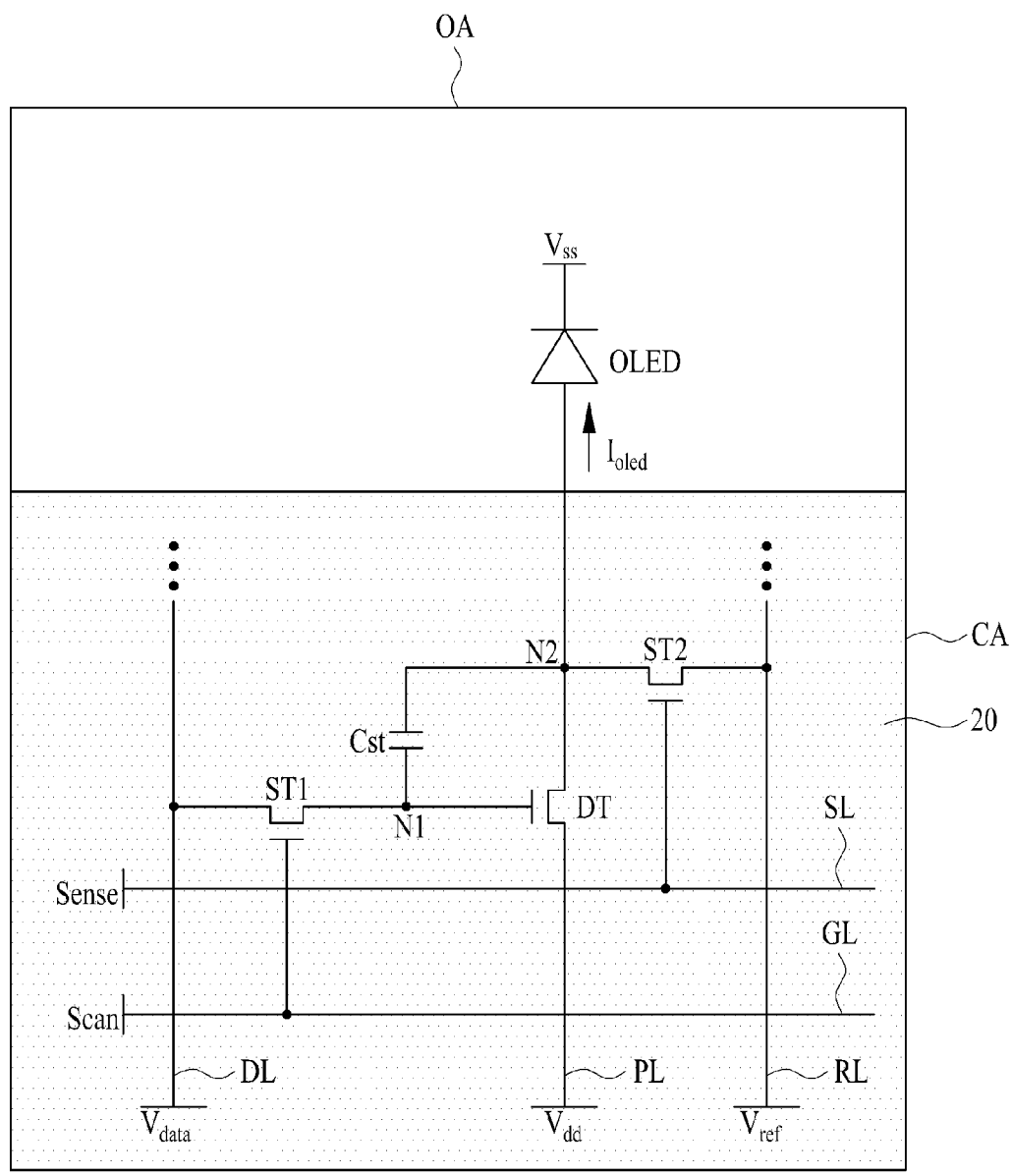
FIG. 1 is an exemplary diagram schematically illustrating a related art organic light emitting display device.

Reference will now be made in detail to the exemplary embodiments of the present invention, examples of which are illustrated in the accompanying drawings. Wherever possible, the same reference numbers will be used throughout the drawings to refer to the same or like parts.

In the specification, in adding reference numerals for elements in each drawing, it should be noted that like reference numerals already used to denote like elements in other drawings are used for elements wherever possible.

The terms described in the specification should be understood as follows.

As used herein, the singular forms "a," "an," and "the" are intended to include the plural forms as well, unless the context clearly indicates otherwise. The terms "first" and "second" are for differentiating one element from the other element, and these elements should not be limited by these terms.

It will be further understood that the terms "comprises," "comprising," "has," "having," "includes," and/or "including," when used herein, specify the presence of stated features, integers, steps, operations, elements, and/or components, but do not preclude the presence or addition of one or more other features, integers, steps, operations, elements, components, and/or groups thereof. The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item. The term "on" should be construed as including a case where one element is formed at a top of another element and moreover a case where a third element is disposed therebetween.

Hereinafter, embodiments of the present invention will be described in detail with reference to the accompanying drawings.

Figure 2:
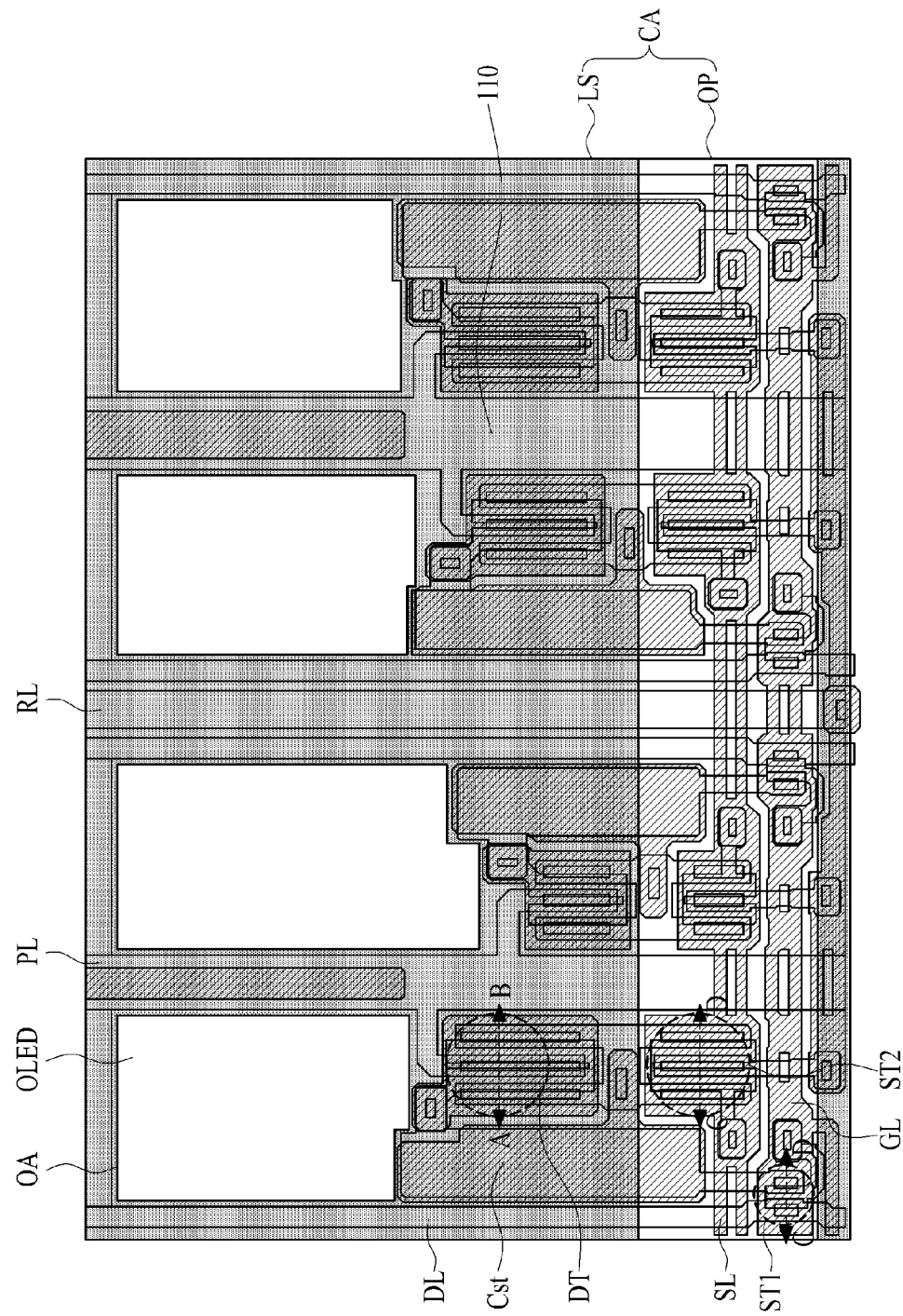
FIG. 2 is a plan view schematically illustrating an organic light emitting display device according to a first embodiment of the present invention.

FIG. 2 is a plan view schematically illustrating an organic light emitting display device according to a first embodiment of the present invention. A pixel circuit unit CA includes a first switching transistor ST1, a second switching transistor ST2, a driving transistor DT, and a capacitor Cst. However, the present invention is not limited thereto. For example, the pixel circuit unit CA can include at least one or more switching transistors. The organic light emitting display device according to the first embodiment includes an emission unit OA, which includes an organic light emitting diode OLED. The organic light emitting display device includes a pixel circuit unit CA. The pixel circuit unit CA includes a first switching transistor ST1, a second switching transistor ST2, a driving transistor DT, a capacitor Cst, a gate line GL, a sensing signal line SL, a data line DL, a driving power line PL, and a reference voltage line RL, which drive the emission unit OA. To provide an additional description, a sub-pixel included in the organic light emitting display device includes the emission unit OA and the pixel circuit unit CA.

The gate line GL and the sensing signal line SL can be formed in parallel in a first direction (e.g., a horizontal direction). The data line DL, the driving power line PL, and the reference voltage line RL can be formed in parallel in a second direction (e.g., a vertical direction) to intersect the gate line GL and the sensing signal line SL. A scan signal (e.g., a gate driving signal) can be applied from a gate driver to the gate line GL, and a sensing signal can be applied to the sensing signal line SL. A data voltage "Vdata" can be supplied from a data driver to the data line DL, a reference voltage "Vref" can be supplied to the reference voltage line RL, and a first driving voltage "Vdd" can be supplied to the driving power line PL. Each of the first switching transistor ST1, the second switching transistor ST2, and the driving transistor DT can be an N-type transistor, and can be formed of an oxide transistor. However, the present embodiment is not limited thereto. For example, each of the transistors ST1, ST2, and DT can be formed of a P-type transistor.

The first switching transistor ST1 is turned on according to the scan signal having a gate-on voltage level supplied to the gate line GL, and supplies the data voltage, via the data line DL, to the driving transistor DT. The second switching transistor ST2 is turned on according to the sensing signal having the gate-on voltage level supplied to the sensing signal line SL, and supplies the reference voltage, via the reference voltage line RL, to the driving transistor DT.

The capacitor Cst is connected to the driving transistor DT. The capacitor Cst is charged with a voltage, and turns on the driving transistor DT with the charged voltage. The driving transistor DT turned on with the voltage of the capacitor Cst controls an amount of current which flows from a first driving voltage terminal to the organic light emitting diode OLED.

The organic light emitting diode OLED emits light with a data current "Ioled" supplied from the driving transistor DT to emit single color light having luminance corresponding to the data current.

To this end, the organic light emitting diode OLED can include an anode electrode connected to a second node "N2", an organic layer formed on the anode electrode, and a cathode electrode formed on the organic layer.

The organic layer can be formed to have a structure of a hole transport layer/organic emission layer/electron transport layer or a structure of a hole injection layer/hole transport layer/organic emission layer/electron transport layer/electron injection layer. The organic layer can further include a function layer for enhancing the emission efficiency and/or service life of the organic emission layer. A second driving voltage "Vss" can be supplied to a cathode electrode of the organic light emitting diode OLED through a second driving power line which is formed as a line type.

When the first switching transistor ST1, the second switching transistor ST2, and the driving transistor DT are each formed of an oxide transistor, a threshold voltage "Vth" is shifted by light. The pixel circuit unit CA can include a light blocking unit LS, including a light blocking layer 110 which is formed for blocking light input to the pixel circuit unit CA. The pixel circuit unit CA can include an opening OP in which the light blocking layer 110 is not formed. In particular, in the organic light emitting display device according to the first embodiment of the present invention, light is blocked by the light blocking unit LS including the light blocking layer 110, and thus, the threshold voltage is prevented from being shifted to a negative polarity (−). Light is input through the opening OP, and thus, the threshold voltage is prevented from being shifted to a positive polarity (+).

The light blocking unit LS, an area in which the light blocking layer 110 is formed, is disposed under the driving transistor DT, and prevents light from being input to the driving transistor DT. The opening OP, which is an area in which the light blocking layer 110 is not formed, is disposed under the first and second switching transistors ST1 and ST2, and allows light to be input to the first and second switching transistors ST1 and ST2. The first and second switching transistors ST1 and ST2 receive a very high switching voltage during a short turn-on period, unlike a driving condition of the driving transistor DT.

The switching voltage is a high voltage of 20 V or more, and is supplied at every frame, and thus, the threshold voltage is shifted to a positive polarity (+). However, when an opening in which the light blocking layer 110 is not formed under the first and second switching transistors ST1 and ST2 is provided, light can be input to the first and second switching transistors ST1 and ST2, and thus, the threshold voltage is prevented from being shifted to a positive polarity (+).

Figure 3A:
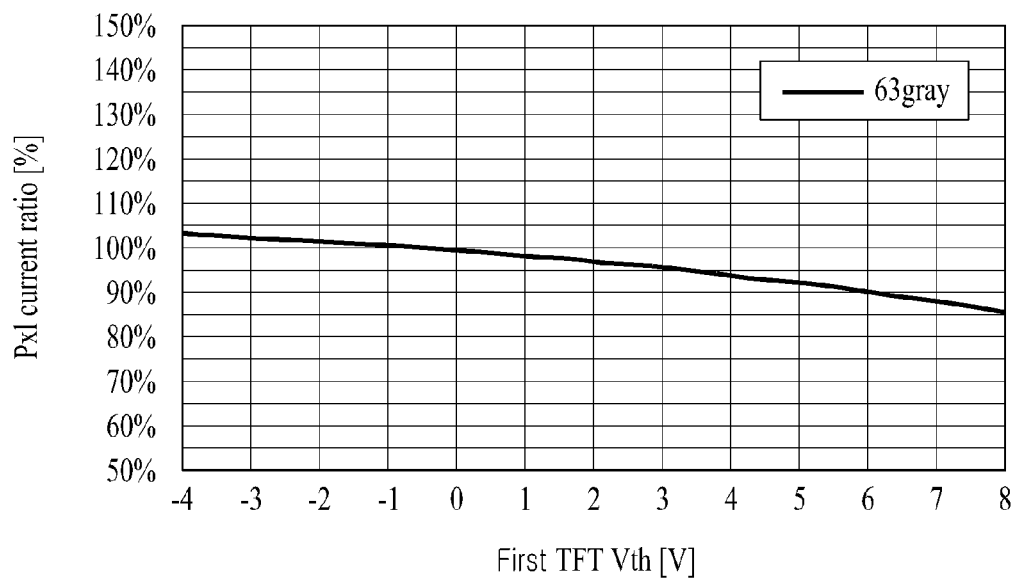
FIGS. 3A and 3B are exemplary diagrams illustrating the changes in an amount of current with respect to threshold voltages of first and second switching transistors.
Figure 3B:
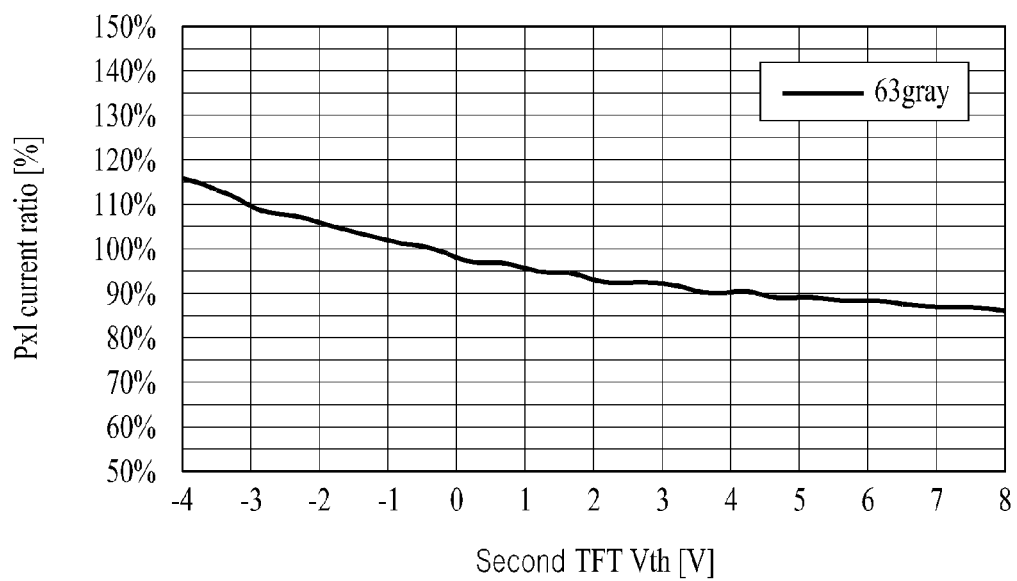

Next, FIGS. 3A and 3B are exemplary diagrams showing the changes in an amount of current with respect to the threshold voltages of the first and second switching transistors. An amount of current is reduced when the threshold voltages of the first and second switching transistors ST1 and ST2 are shifted to a positive polarity (+). Because the opening OP in which the light blocking layer 110 is not formed is provided under the first and second switching transistors ST1 and ST2, light can be input to the first and second switching transistors ST1 and ST2, and thus, the threshold voltage is shifted to a negative polarity (−), causing an increase in an amount of current.

Figure 4:
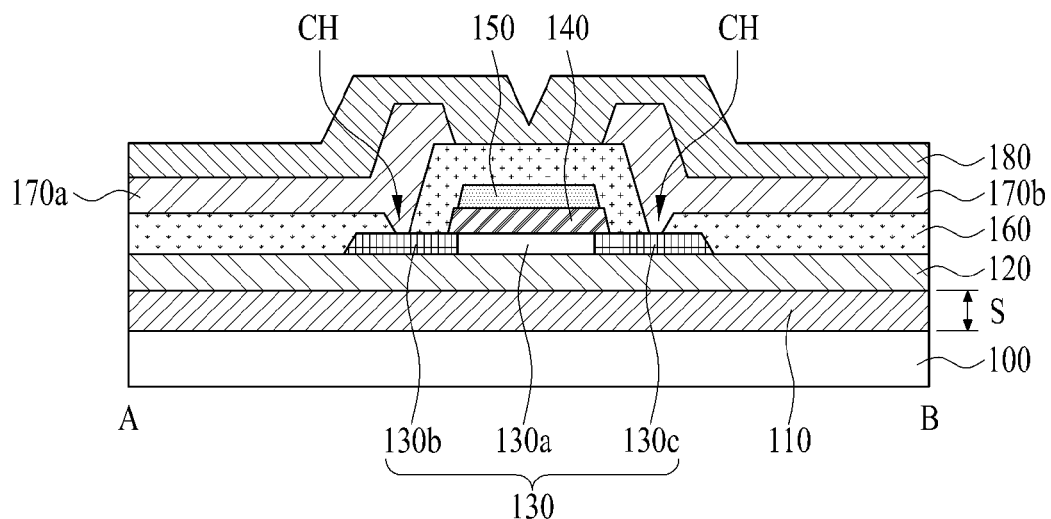
FIG. 4 is a cross-sectional view schematically illustrating a driving transistor according to the first embodiment of the present invention.

Next, FIG. 4 is a cross-sectional view schematically illustrating the driving transistor according to the first embodiment of the present invention, and illustrates a cross-sectional surface taken along line A-B of FIG. 2. The driving transistor DT includes the light blocking layer 110, a buffer layer 120, an active layer 130, a gate insulating layer 140, a gate electrode 150, an inter-layer dielectric 160, a source electrode 170a, a drain electrode 170b, and a protective layer 180 which are sequentially formed on a substrate 100.

The substrate 100 is formed of a transparent insulating substrate formed of glass, quartz, ceramic, or plastic. However, the present embodiment is not limited thereto. For example, when the substrate 100 is formed of plastic, the substrate 100 can be formed of a flexible substrate. The light blocking layer 110, which blocks light input to the active layer 130, is formed on the substrate 100. The light blocking layer 110 can be formed of one of a conductor, semiconductor such as amorphous silicon or amorphous germanium, and a black resin material, and can be formed of a light-blocking material.

Moreover, the threshold voltage of the driving transistor can be shifted by adjusting a thickness S of the light blocking layer 110. That is, when the light blocking layer 110 is thickly formed, an amount of light input to a transistor is reduced, and when the light blocking layer 110 is thinly formed, an amount of light input to the transistor increases. Therefore, the light blocking layer 110 can be thickly formed to allow the threshold voltage to be shifted to a positive polarity (+). Also, the light blocking layer 110 can be thinly formed to allow the threshold voltage to be shifted to a negative polarity (−).

The buffer layer 120 is formed on the light blocking layer 110, and can be formed of an inorganic insulating material such as oxide silicon ($SiO_2$) or nitride silicon ($SiNx$). The buffer layer 120 is provided for preventing a characteristic of the active layer 130 from being degraded due to an alkali ion which is emitted from the inside of the substrate 100 when the active layer 130 formed on the buffer layer 120 is crystallized. However, when the active layer 130 for which a crystallization process is not performed is provided, the buffer layer 120 cannot be provided.

The active layer 130 includes an active area 130a which is formed of silicon and configures a channel, and source and drain areas 130b and 130c on which high-concentration impurities are doped are provided at both side surfaces of the active area 130a. The gate insulating layer 140 is formed on the active layer 130. The gate electrode 150 and a gate line can be formed on the gate insulating layer 140. The inter-layer dielectric 160 is formed all over the substrate in which the gate electrode 150 and the gate line are formed. In this case, the inter-layer dielectric 160 includes a contact hole CH that contacts the source and drain electrodes with the source and drain areas 130b and 130c disposed at the both side surfaces of the active area 130a. The source and drain electrodes 170a and 170b, which are separated from each other and respectively contact the source and drain areas 130b and 130c exposed through the contact hole CH, are formed on the inter-layer dielectric 160 including the contact hole CH. The protective layer 180 is formed on the source and drain electrodes 170a and 170b.

In the following description, repetitive descriptions on a material and structure of each element are not provided.

Figure 5:
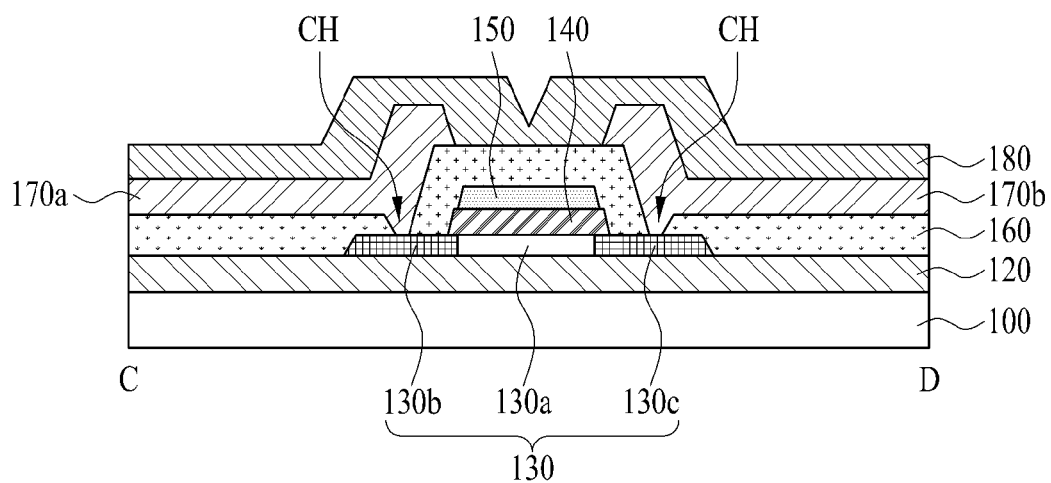
FIG. 5 is a cross-sectional view schematically illustrating first and second switching transistors according to the first embodiment of the present invention.

Next, FIG. 5 is a cross-sectional view schematically illustrating the first and second switching transistors according to the first embodiment of the present invention, and illustrates a cross-sectional surface taken along line C-D of FIG. 2. The first and second switching transistors of FIG. 5 are the same as the above-described driving transistor of FIG. 4 except the light blocking layer 110 has been removed. Thus, like reference numerals refer to like elements, and descriptions on the same elements are not repeated. As seen in FIG. 5, each of the first and second switching transistors ST1 and ST2 (refer to FIG. 2), which have the light blocking layer 110 removed, includes a buffer layer 120, an active layer 130, a gate insulating layer 140, a gate electrode 150, an inter-layer dielectric 160, a source electrode 170a, a drain electrode 170b, and a protective layer 180 which are sequentially formed on a substrate 100.

As described above, according to the present embodiment, the light blocking layer 110 is not formed in an area where the first and second switching transistors ST1 and ST2 are formed, and thus, light can be input to the first and second switching transistors ST1 and ST2. Accordingly, the threshold voltage can be prevented from being shifted to a positive polarity (+).

To this end, the organic light emitting display device according to the present embodiment includes a pixel circuit unit CA which includes at least one or more switching transistors ST1 and ST2 and a driving transistor DT. The pixel circuit unit CA includes a light blocking unit LS, including a light blocking layer 110 which is formed for blocking light input to the driving transistor DT, and an opening OP in which the light blocking layer 110 is not formed in order for light to be input to the first and second switching transistors ST1 and ST2. The organic light emitting display device according to the present embodiment selectively blocks light input to the pixel circuit unit CA to adjust the threshold voltage, thereby enhancing a reliability of the threshold voltage.

Figure 6:
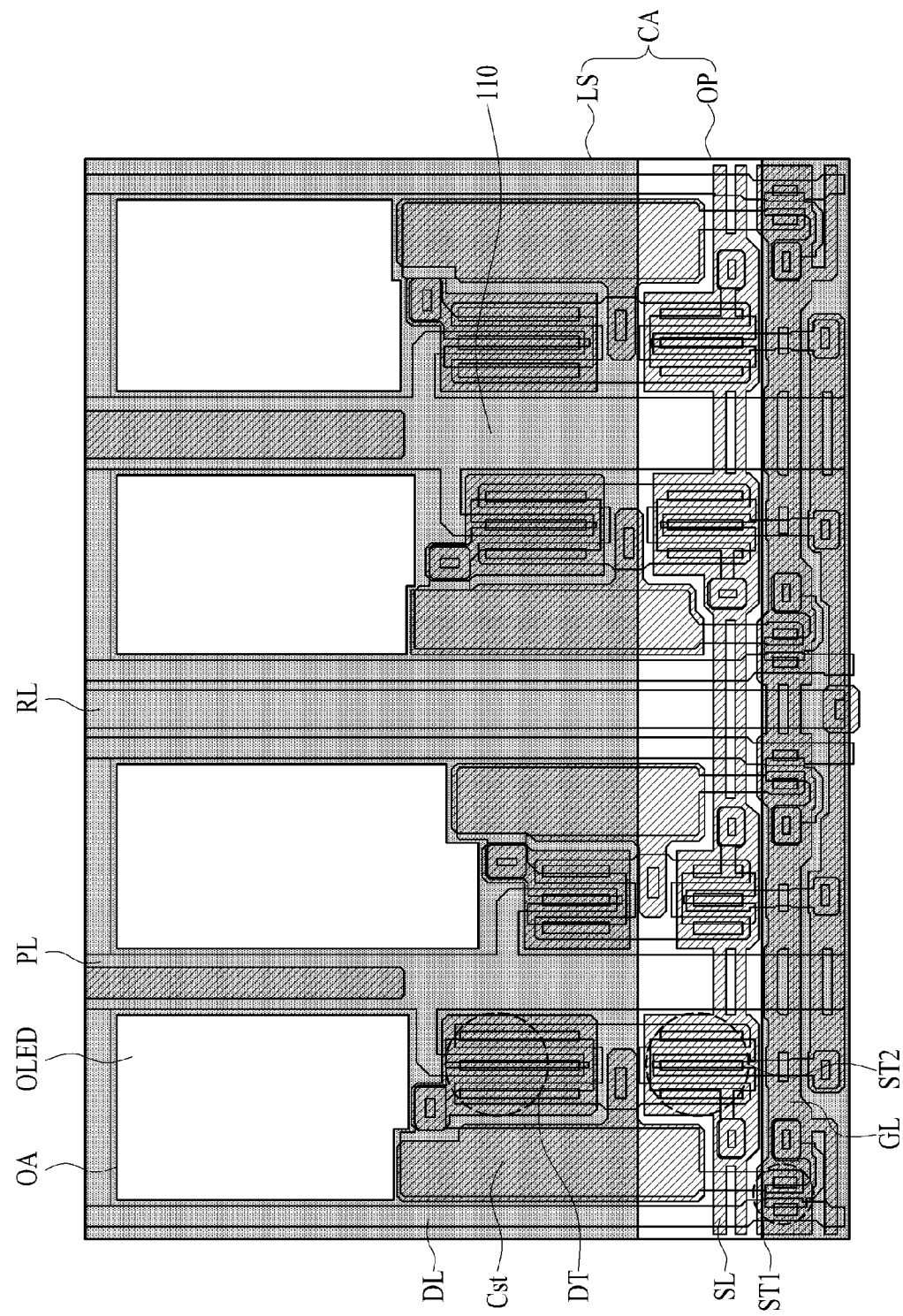
FIG. 6 is a plan view schematically illustrating an organic light emitting display device according to a second embodiment of the present invention.

Next, FIG. 6 is a plan view schematically illustrating an organic light emitting display device according to a second embodiment of the present invention. The organic light emitting display device of FIG. 6 is the same as the organic light emitting display device of FIG. 2 except a structure of the pixel circuit unit CA is different. Thus, like reference numerals refer to like elements, and descriptions for the same elements are not repeated.

The organic light emitting display device according to the second embodiment includes an emission unit OA, which includes an organic light emitting diode OLED, and a pixel circuit unit CA that includes at least one or more switching transistors (e.g., a first switching transistor ST1 and a second switching transistor ST2), a driving transistor DT, a capacitor Cst, a gate line GL, a sensing signal line SL, a data line DL, a driving power line PL, and a reference voltage line RL, which drive the emission unit OA.

Here, the pixel circuit unit CA includes a light blocking unit LS, including a light blocking layer 110 which is formed for blocking light input to the pixel circuit unit CA, and an opening OP in which the light blocking layer 110 is not formed. The opening OP is an area in which the at least one or more switching transistors (e.g., the first switching transistor ST1 and the second switching transistor ST2) are formed, and the light blocking unit LS is an area other than the emission unit OA and the opening OP in a sub-pixel which includes the emission unit OA and the pixel circuit unit CA. Degrees of stresses of the first and second switching transistors ST1 and ST2 can be changed depending on driving times of the first and second switching transistors ST1 and ST2 to shift a threshold voltage of the driving transistor DT. Accordingly, the opening OP is formed in an area where one of the first and second switching transistors ST1 and ST2 is formed, and thus, a threshold voltage shift can be effectively controlled, thereby enhancing a reliability of the threshold voltage.

Figure 7:
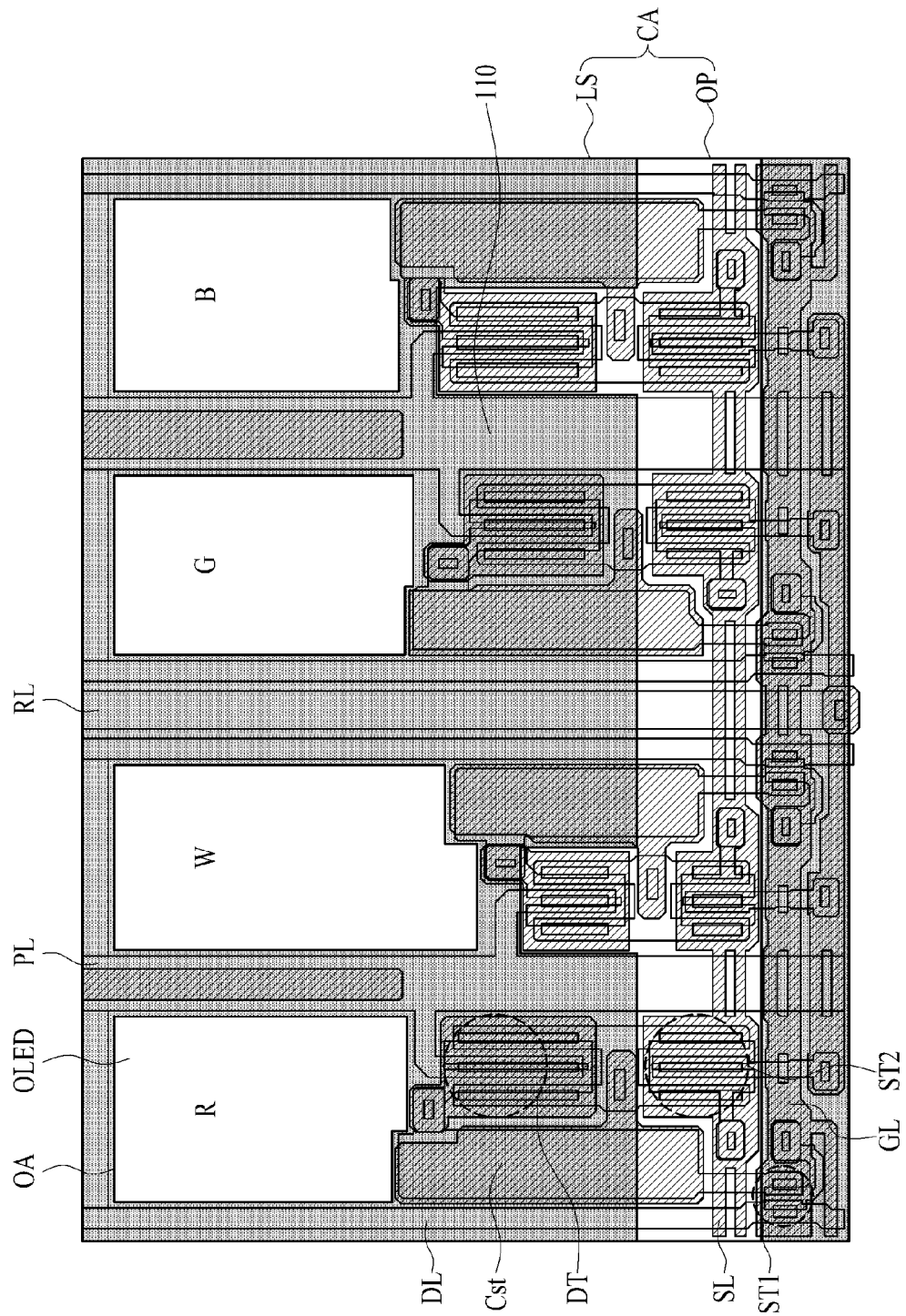
FIG. 7 is a plan view schematically illustrating an organic light emitting display device according to a third embodiment of the present invention.

Next, FIG. 7 is a plan view schematically illustrating an organic light emitting display device according to a third embodiment of the present invention. The organic light emitting display device of FIG. 7 is the same as the organic light emitting display device of FIG. 2 except that a structure of a pixel circuit unit CA is different. Thus, like reference numerals refer to like elements, and descriptions on the same elements are not repeated. As seen in FIG. 7, the organic light emitting display device according to the third embodiment includes an emission unit OA, which includes an organic light emitting diode OLED, and a pixel circuit unit CA that includes at least one or more switching transistors (e.g., a first switching transistor ST1 and a second switching transistor ST2), a driving transistor DT, a capacitor Cst, a gate line GL, a sensing signal line SL, a data line DL, a driving power line PL, and a reference voltage line RL, which drive the emission unit OA.

The pixel circuit unit CA includes a light blocking unit LS, including a light blocking layer 110 which is formed for blocking light input to the pixel circuit unit CA, and an opening OP in which the light blocking layer 110 is not formed. An area in which the light blocking unit LS and the opening OP are formed can be different depending on a color R, W, G or B of a sub-pixel including the emission unit OA.

When the sub-pixel emits white (W) or blue (B) light, the opening OP is an area in which the at least one or more switching transistors (e.g., the first switching transistor ST1 and the second switching transistor ST2) and the driving transistor DT are formed. When the sub-pixel emits red (R) or green (G) light, the opening OP is an area in which the second switching transistor ST2 is formed. In this case, the light blocking unit LS is an area other than the emission unit OA and the opening OP in a sub-pixel which includes the emission unit OA and the pixel circuit unit CA.

A frequency at which white (W) or blue (B) light is emitted by a sub-pixel is higher than a frequency at which red (R) or green (G) light is emitted by the sub-pixel. That is, the number of times the threshold voltage of the driving transistor DT is shifted to a positive polarity (+) is higher when the sub-pixel emits white (W) or blue (B) light than when the sub-pixel emits red (R) or green (G) light. Therefore, when the sub-pixel emits white (W) or blue (B) light, the light blocking layer 110 is not formed in an area where the driving transistor DT is formed, and thus, the threshold voltage can be prevented from being shifted to a positive polarity (+).

Figure 8A:
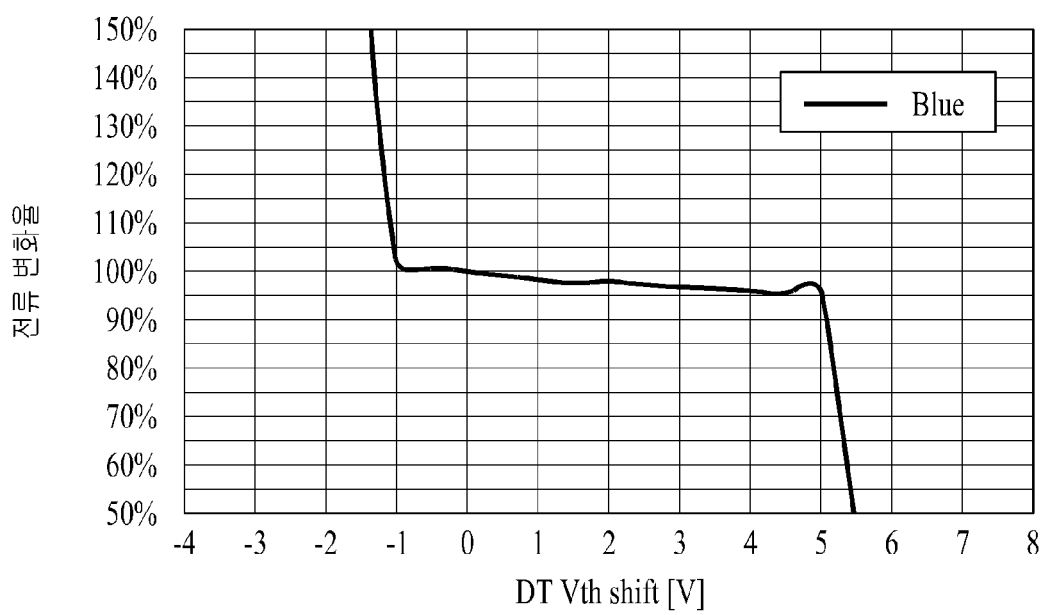
FIGS. 8A and 8B are exemplary diagrams illustrating the changes in an amount of current with respect to a threshold voltage of a driving transistor when a sub-pixel emits white and blue light.
Figure 8B:
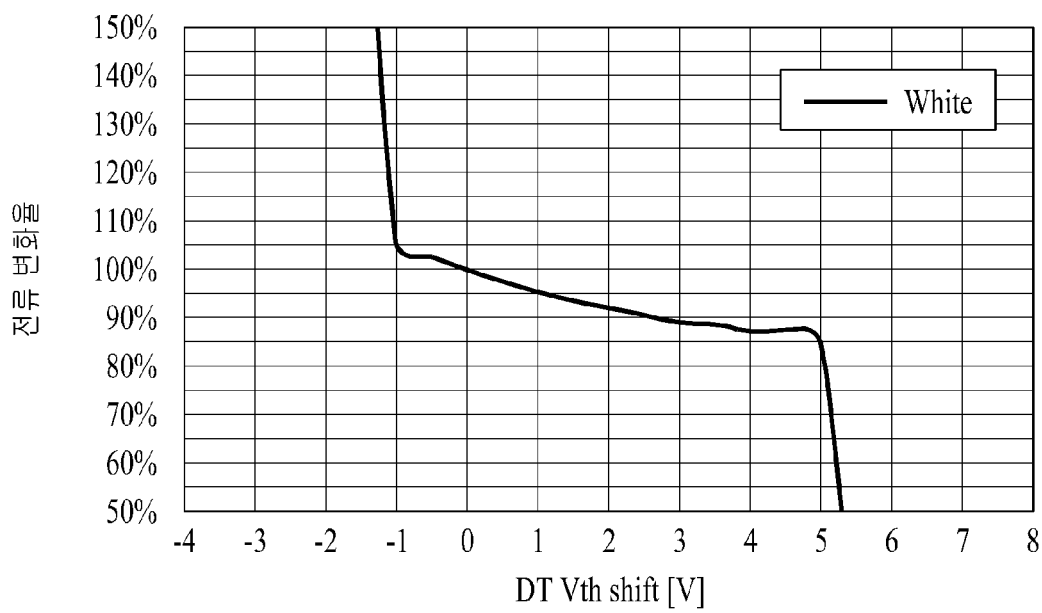

Next, FIGS. 8A and 8B are exemplary diagrams showing the changes in an amount of current with respect to a threshold voltage of a driving transistor when the sub-pixel emits white (W) or blue (B) light according to the third embodiment of the present invention. When the sub-pixel emits white (W) or blue (B) light, the threshold voltage of the driving transistor DT is shifted to a positive polarity (+), and thus, an amount of data current "Ioled" is reduced. The opening OP is included in the driving transistor DT of the sub-pixel emitting white (W) or blue (B) light, and light is input to the driving transistor DT. Therefore, the threshold voltage can be shifted to a negative polarity (−), and thus, an amount of current increases.

Next, FIG. 9 is a plan view schematically illustrating an organic light emitting display device according to a fourth embodiment of the present invention. The organic light emitting display device of FIG. 9 is the same as the organic light emitting display device of FIG. 7 except that a structure of an opening OP formed in an area where a driving transistor DT is formed is different. Thus, like reference numerals refer to like elements, and descriptions on the same elements are not repeated.

A pixel circuit unit CA includes a light blocking unit LS, including a light blocking layer 110 which is formed for blocking light input to the pixel circuit unit CA, and an opening OP in which the light blocking layer 110 is not formed. In this case, the light blocking unit LS and the opening OP can be different depending on a color R, W, G or B of a sub-pixel including the emission unit OA. When the sub-pixel emits white (W) or blue (B) light, the opening OP is an area in which at least one or more switching transistors (e.g., the second switching transistor ST2) and the driving transistor DT are formed. When the sub-pixel emits red (R) or green (G) light, the opening OP is an area in which the second switching transistor ST2 is formed, and the light blocking unit LS is an area other than the emission unit OA and the opening OP.

In the organic light emitting display device according to the fourth embodiment of the present invention, when the sub-pixel emits white (W) or blue (B) light, the opening OP in which the light blocking layer 110 is not formed is provided at a portion d of an area in which the driving transistor DT is formed. Therefore, in the organic light emitting display device according to the fourth embodiment of the present invention, a threshold voltage shift of the driving transistor DT is adjusted according to a value of a frequency at which white (W) or blue (B) light is emitted by the sub-pixel, thereby enhancing a reliability of the threshold voltage. For example, the pixel circuit unit CA can have a 3T1C structure which includes the first switching transistor ST1, the second switching transistor ST2, the driving transistor DT, and the capacitor Cst. Or, the pixel circuit unit CA can have a 2T1C structure and a second switching transistor ST2 that does not have an opening OP. The organic light emitting display device includes the pixel circuit unit, the light blocking unit that includes the light blocking layer formed for blocking light input to the pixel circuit unit, and the opening in which the light blocking layer is not formed. The organic light emitting display device selectively blocks the light input to the pixel circuit unit, thereby adjusting the threshold voltage of the driving transistor to enhance a reliability of the threshold voltage. The opening can be provided in an area where one or more switching transistors are formed to effectively control a threshold voltage shift thereby implementing a stable switching function.

When the sub-pixel including the emission unit emits white (W) or blue (B) light, the opening is provided in an area where the switching transistor and the driving transistor are formed, and when the sub-pixel emits red (R) or green (G) light, the opening is provided in an area where the switching transistor is formed, thereby adjusting the threshold voltages of the white (W) or blue (B) sub-pixels to enhance a reliability of the threshold voltages. When the sub-pixel including the emission unit emits white (W) or blue (B) light, the opening is provided in only a portion of an area where the driving transistor is formed, and thus, a threshold voltage shift of the driving transistor is adjusted based on a value of a frequency corresponding to light emitted by white (W) or blue (B) sub-pixels, thereby enhancing a reliability of the threshold voltage.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display device comprising:
   an emission unit including an organic light emitting diode; and
   a pixel circuit unit including:
   a driving transistor,
   at least one or more switching transistors,
   a capacitor,
   a light blocking unit, and
   an opening in which the light blocking layer is not provided and in which a sub-pixel and the at least one or more switching transistors are provided,
   wherein,
      the light blocking unit includes a light blocking layer which blocks light input to the pixel circuit unit, and
      the pixel circuit unit is configured to drive the emission unit and selectively block the light input to the pixel circuit unit.

2. The organic light emitting display device of claim 1, wherein,
   the light blocking unit is an area other than the emission unit and the opening in a sub-pixel which includes the emission unit and the pixel circuit unit, and
   the light blocking unit includes a portion of the capacitor.

3. The organic light emitting display device of claim 1, wherein an area in which the light blocking unit and the opening are provided in a sub-pixel is different depending on a color of light emitted from a sub-pixel including the emission unit.

4. The organic light emitting display device of claim 3, wherein,
   when the sub-pixel is configured to emit white or blue light, the opening is an area in which the at least one or more switching transistors and the driving transistor are provided,
   when the sub-pixel is configured to emit red or green light, the opening is an area in which the at least one or more switching transistors are formed.

5. The organic light emitting display device of claim 4, wherein,
   when the sub-pixel is configured to emit white or blue light, the opening is a portion of an area in the sub-pixel, in which the at least one or more switching transistors are provided, and a portion of an area in which the driving transistor is provided.

6. The organic light emitting display device of claim 1, wherein each of the at least one or more switching transistors and the driving transistor includes an active layer, a gate electrode, a source electrode, and a drain electrode.

7. The organic light emitting, display device of claim 6, wherein the active layer is formed of an oxide semiconductor.

8. The organic light emitting display device of claim 1, wherein the light blocking layer is formed of one of a conductive material, a semiconductor material, and a black resin material.

9. The organic light emitting display device of claim 1, wherein a light transmittance of the light blocking layer is changed depending on a thickness of the light blocking layer.

10. The organic light emitting display device of claim 1, further comprising:
    a driving power line;
    a reference voltage line; and
    a data line,
    wherein the light blocking unit includes a portion of each of the driving power line, the reference voltage line, and the data line.

11. An organic light emitting display device comprising:
    an emission unit including an organic light emitting diode;
    a capacitor;
    a light blocking unit provided wider a driving transistor and including a light blocking layer, the light blocking unit configured to prevent light from being input to the driving transistor; and
    a pixel circuit unit including first and second switching transistors and an opening which is an area in which the light blocking layer is not provided, the pixel circuit unit being configured to drive the emission unit,
    wherein the opening is an area in which the first and second switching transistors are provided, and
    wherein the light blocking layer is configured to allow light input to the first and second switching transistors.

12. The organic light emitting display device of claim 11, wherein,
    the light blocking unit is an area other than the emission unit and the opening in a sub-pixel which includes the emission unit and the pixel circuit unit, and
    the light blocking unit includes a portion of the capacitor.

13. The organic light emitting display device of claim 11, wherein an area in which the light blocking unit and the opening are provided in a sub-pixel is different depending on a color of light emitted from a sub-pixel including the emission unit.

14. The organic light emitting display device of claim 13, wherein,
when the sub-pixel is configured to emit white or blue light, the opening is an area in which the first and second switching transistors and the driving transistor are formed,
when the sub-pixel is configured to emit red or green light, the opening is an area in which the first and second switching transistors are provided.

15. The organic light emitting display device of claim 14, wherein,
when the sub-pixel is configured to emit white or blue light, the opening is a portion of an area in the sub-pixel, in which the first and second switching transistors are provided, and a portion of an area in which the driving transistor is provided.

16. The organic light emitting display device of claim 11, wherein each of the first and second switching transistors and, the driving transistor includes an active layer, a gate electrode, a source electrode, and a drain electrode.

17. The organic light emitting display device of claim 16, wherein the active layer is formed of an oxide semiconductor.

18. The organic light emitting display device of claim 11, wherein the light blocking layer is formed of one of a conductive material, a semiconductor material, and a black resin material.

19. The organic light emitting display device of claim 11, wherein a light transmittance of the light blocking layer is changed depending on a thickness of the light blocking layer.

* * * * *